United States Patent
Kim et al.

(10) Patent No.: US 9,325,349 B2
(45) Date of Patent: Apr. 26, 2016

(54) ENCODER, DECODER AND SEMICONDUCTOR DEVICE INCLUDING THE SAME

(71) Applicant: SK hynix Inc., Icheon-si Gyeonggi-do (KR)

(72) Inventors: Joon-Woo Kim, Icheon-si (KR); Hong-Sik Kim, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 101 days.

(21) Appl. No.: 14/254,012

(22) Filed: Apr. 16, 2014

(65) Prior Publication Data

US 2014/0317472 A1    Oct. 23, 2014

(30) Foreign Application Priority Data

Apr. 22, 2013   (KR) .................. 10-2013-0043887

(51) Int. Cl.
| | | |
|---|---|---|
| *G06F 11/10* | (2006.01) | |
| *H03M 13/21* | (2006.01) | |
| *H03M 13/13* | (2006.01) | |
| *G11C 11/56* | (2006.01) | |
| *G11C 13/00* | (2006.01) | |

(52) U.S. Cl.
CPC .......... *H03M 13/21* (2013.01); *G11C 11/5678* (2013.01); *G11C 13/004* (2013.01); *H03M 13/134* (2013.01)

(58) Field of Classification Search
CPC .................................................. G06F 11/1008
USPC .................................................. 714/767, 763
See application file for complete search history.

(56) References Cited

U.S. PATENT DOCUMENTS

| | | | | |
|---|---|---|---|---|
| 5,428,241 A | * | 6/1995 | Terashima .......... | H01L 29/0615 257/336 |
| 2011/0296274 A1 | | 12/2011 | Miteelholzer et al. | |
| 2011/0302475 A1 | * | 12/2011 | Eisenhuth .......... | G06F 11/1012 714/763 |

OTHER PUBLICATIONS

Andre Martin McDonald, The Analysis of Enumerative Source Codes and Their Use in Burrows-Wheeler Compression Algorithms, University of Pretoria Dissertation for Master of Engineering (Electronic Engineering) Feb. 2010.
Thomas M. Cover, Enumerative Source Encoding, IEEE Transactions on Information Theory, Jan. 1973, pp. 73-77, vol. 19 No. 1.

* cited by examiner

*Primary Examiner* — Fritz Alphonse
(74) *Attorney, Agent, or Firm* — William Park & Associates Ltd.

(57) ABSTRACT

Provided is a semiconductor device configured to encode input data into a codeword including M different symbols, each of which includes $N_m$ symbols. The semiconductor device including a first storage unit configured to store a first state value which is reset according to M and $N_m$; a second storage unit corresponding to any one of the M different symbols and configured to store M second state values determined through the corresponding symbol and the first state value; a third storage unit configured to store a third state value.

26 Claims, 16 Drawing Sheets

FIG. 2

| Data (64bit) | Index | Codeword (36cell) |
|---|---|---|
| 0000....0000 | 0 | 000000000111111111222222223333333333 |
| 0000....0001 | 1 | 000000000111111111222222223233333333 |
| 0000....0010 | 2 | 000000000111111111222222232233333333 |
| ... | ... | ... |
| 1111....1101 | 18446744073709551613 | 312301312022212130212302310100031303 |
| 1111....1110 | 18446744073709551614 | 312301312022212130212302310100031330 |
| 1111....1111 | 18446744073709551615 | 312301312022212130212302310100033013 |
|  | ... | ... |
|  | 2.1453 × 10$^{19}$ | 333333333222222222111111110000000 |

FIG. 5

|     | pow2 | pow3 | pow5 | pow7 | Const |
|-----|------|------|------|------|-------|
| 35! | 32   | 15   | 8    | 5    | $C_{35}$ |
| 34! | 32   | 15   | 7    | 4    | $C_{34}$ |
| 33! | 31   | 15   | 7    | 4    | $C_{33}$ |
| ... | ...  | ...  | ...  | ...  | ...   |
| 9!  | 7    | 4    | 1    | 1    | $C_9$ |
| 8!  | 7    | 2    | 1    | 1    | $C_8$ |
| ... | ...  | ...  | ...  | ...  | ...   |

$$\frac{35!}{8!9!9!9!} = 2^{32-7-7\cdot3} \cdot 3^{15-2-4\cdot3} \cdot 5^{8-1-1\cdot3} \cdot 7^{5-1-1\cdot3} \cdot \frac{C_{35}}{C_8 C_9^3} = 2^4 \cdot 3^1 \cdot 5^4 \cdot 7^1 \cdot \frac{C_{35}}{C_8 C_9^3}$$

US 9,325,349 B2

ENCODER, DECODER AND SEMICONDUCTOR DEVICE INCLUDING THE SAME

CROSS-REFERENCE TO RELATED APPLICATIONS

The present application claims priority of Korean Patent Application No. 10-2013-0043887, filed on Apr. 22, 2013, which is incorporated herein by reference in its entirety.

BACKGROUND

1. Technical Field

Various embodiments relate to an encoder, a decoder, and a semiconductor device including the same. Various embodiments also relate to an encoder, a decoder, and a semiconductor device including the same, which are capable of processing data such that the data may be recovered.

2. Related Art

In a memory device such as, for example, a PCRAM, a drift may occur as time elapses. The drift may indicate a phenomenon whereby information of a memory cell is changed as time increases.

When a drift occurs, information read from a memory cell may differ from the original information that was written originally to the memory cell. Thus, it is not easy to recover the original data. For example, in the case where a memory device is storing multi-bit data, a drift may make it even more difficult to recover data.

SUMMARY

In an embodiment, there is provided a semiconductor device that may encode input data into a codeword including M different symbols, each of which includes $N_m$ symbols. M, m, and $N_m$ may be natural numbers and m is greater than or equal to one and m is less than or equal to M. The semiconductor device may include a first storage unit configured to store a first state value which may be reset according to M and $N_m$, and a second storage unit corresponding to any one of the M different symbols and configured to store M second state values determined through the corresponding symbol and the first state value. The semiconductor device may also include a third storage unit configured to store a third state value and reset the third state value to the value of the input data. The semiconductor device may also include a comparator configured to compare the M second state values to the third state value. The semiconductor device may also include a controller configured to select any one of the M different symbols as one of symbols forming the codeword according to the comparison result, and update the first state value and the third state value.

In an embodiment, a semiconductor device may decode a codeword including M different symbols, each of which includes $N_m$ symbols. M, m, and $N_m$ may be natural numbers and m is greater than or equal to one and m is less than or equal to M. The semiconductor device may include a first storage unit configured to store a first state value which may be reset according to M and $N_m$, and a second storage unit corresponding to any one of the M different symbols and configured to store M second state values determined through the corresponding symbol and the first state value. The semiconductor device may also include a third storage unit configured to store a decoding result. The semiconductor device may also include a controller configured to select any one of the M second state values according to a currently selected symbol of the codeword, and update the first storage unit and the third storage unit using the selected second state value.

In an embodiment, a semiconductor device may encode input data into a codeword including M different symbols, each of which includes $N_m$ symbols. M, m, and $N_m$ may be natural numbers and m is greater than or equal to one and m is less than or equal to M. The semiconductor device may include a first storage unit configured to store a first state value which is reset according to M and $N_m$, and a third storage unit configured to store a third state value and reset the third state value to the value of the input data. The semiconductor device may also include a comparator configured to compare M second state values to the third state value, and a controller corresponding to any one of the M different symbols and configured to generate the M second state values determined through the corresponding symbol and the first state value. The controller of the semiconductor device may select any one of the M different symbols as one of a plurality of symbols forming the codeword according to the comparison result, and may update the first state value and the third state value.

In an embodiment, a semiconductor device may decode a codeword including M different symbols, each of which includes $N_m$ symbols. M, m, and $N_m$ may be natural numbers and m is greater than or equal to one and m is less than or equal to M. The semiconductor device may include a first storage unit configured to store a first state value which may be reset according to M and $N_m$, and a third storage unit configured to store a decoding result. The semiconductor device may also include a controller corresponding to any one of the M different symbols and may be configured to generate M second state values determined through the corresponding symbol and the first state value. The controller of the semiconductor device may also select any one of the M second state values according to a currently selected symbol of the codeword, and may update the first storage unit and the third storage unit using the selected second state value.

In an embodiment, a semiconductor device may include an encoder configured to encode data provided from a host into a codeword including M different symbols, each of which includes $N_m$ symbols. $N_m$ may be a natural number and m is greater than or equal to one and m is less than or equal to M, and the semiconductor device may also include a decoder configured to decode the codeword provided from a semiconductor memory device.

In an embodiment, a semiconductor device may include a memory cell array configured to store a codeword including M different symbols, each of which includes $N_m$ symbols. $N_m$ may be a natural number and m is greater than or equal to one and m is less than or equal to M, and the semiconductor device may also include an encoder configured to encode input data into the codeword and input the encoded data to the memory cell array. Additionally, the semiconductor device may include a decoder configured to decode the codeword received from the memory cell array and output the decoded codeword.

BRIEF DESCRIPTION OF THE DRAWINGS

FIG. 2 is a table for illustrating the relation between data and codewords which are used in a semiconductor device in accordance with an embodiment.

FIG. 5 illustrates a lookup table and a method for calculating the magnitudes of first and second state values using the lookup table.

DETAILED DESCRIPTION

Figure 1:
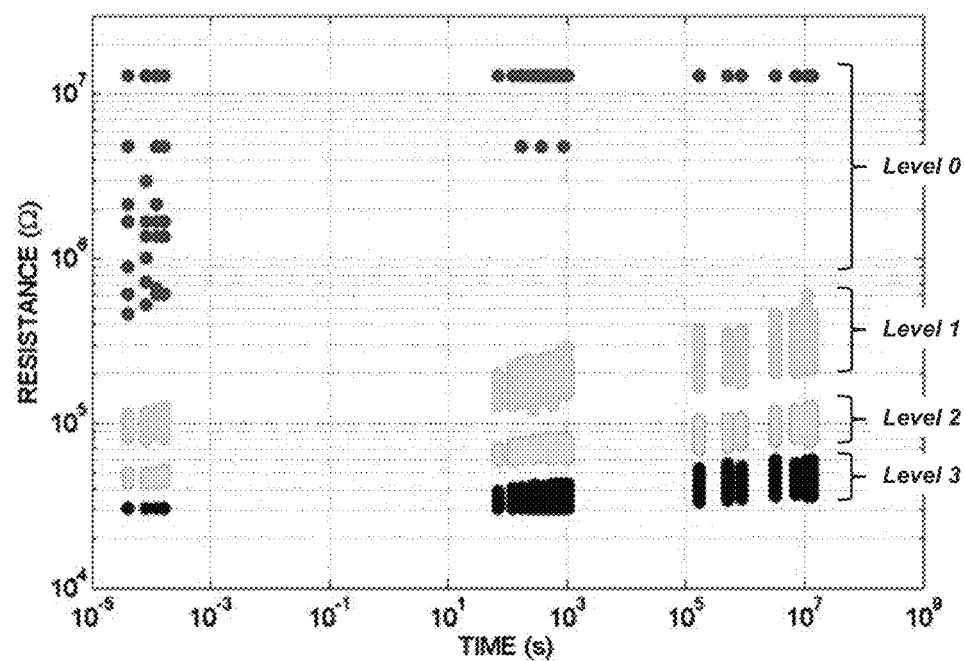
FIG. 1 is a graph illustrating the change in resistance of a PCRAM cell, caused by a drift.

Various embodiments will be described below in more detail with reference to the accompanying drawings. The embodiments may be embodied in different forms and should not be construed as limited to the embodiments set forth herein. Rather, these embodiments are provided so that this disclosure will be thorough and complete, and will fully convey the scope. Throughout the disclosure, like reference numerals refer to like parts throughout the various figures and embodiments.

An encoding and decoding technique for possibly overcoming a drift in a memory device such as, for example, PCRAM amongst other memory devices will be discussed below. As mentioned, the memory device is not limited to PCRAM, but may be applied with other volatile or nonvolatile memory devices in which a drift occurs.

FIG. 1 is a graph illustrating the change in resistance of a PCRAM cell, caused by a drift.

Referring to FIG. 1, the PCRAM cell is a multi-level cell capable of storing 2-bit data, and may store four kinds of state information such as level 0 (00), level 1 (01), level 2 (10), and level 3 (11). The largest resistance value corresponds to level 0, and the smallest resistance value corresponds to level 3.

When a drift occurs, the resistance of each cell is changed. As seen in FIG. 1, the resistance of each cell is increased when a drift occurs. However, although the resistance value of each cell increases, the resistance values corresponding to the respective levels do not overlap with each other, and maintain a predetermined order.

Thus, the boundary value between the respective levels may be used to recover the levels of the memory cells. The performance is likely to be degraded because the statistical distribution of measured resistance values must be analyzed before setting the boundary value.

In an embodiment, a difference in magnitude between multiple resistance values may be used to determine the logic level of a memory cell, instead of a boundary value. For example, when different symbols are inputted to or outputted from a memory device, resistance values read from the memory device may be arranged in order of magnitude. Then, according to the order of magnitude, logic levels may be automatically designated to simply recover the logic levels of the resistance values read from the memory device.

In the following disclosure, a code which includes M different symbols, each of which includes $N_m$ symbols, and is used to prevent a drift will be referred to as a codeword. Additionally, M, m, and $N_m$ may be natural numbers, and $1 \leq m \leq M$. Hereafter, an encoder for encoding data to be input into a memory device as a codeword will be described. Hereafter, a decoder for decoding a codeword read from a memory device into normal data will be described. Also a semiconductor device including the same will be described.

FIG. 2 illustrates a table for showing the relation between data and codewords which may be used in a semiconductor device.

Referring to FIG. 2, an embodiment in which data requested from a host are processed in units of 64 bits and a codeword for the data includes four different symbols, each of which includes nine symbols.

The types of symbols correspond to the types of levels stored in one memory cell. Thus, referring to Equation 1 below, the types M of symbols may be set according to the number m of bits stored in each cell.

$$M = 2^m \qquad \text{[Equation 1]}$$

Additionally, referring to Equation 2 below, the length L of data, the number M of symbol types, and the number $N_m$ of symbols must satisfy Equation 2. Also, M, $N_m$, and m may be natural numbers, and $1 \leq m \leq M$. In Equation 2, $N_m$ may be a natural number which has the same value or a different value, depending on m.

$$2^L \leq \frac{\left(\sum_{m=1}^{m=M} N_m\right)!}{N_1! \times \ldots \times N_M!} \qquad \text{[Equation 2]}$$

In an embodiment, the correlation between data and codewords may be set by the magnitudes of the data and the magnitudes of the codewords. Referring to FIG. 2, the data may be arranged in order of magnitude from the smallest value to the largest value, and the codewords may be arranged in order of magnitude from the smallest value to the largest value. The magnitude order is indicated by the indexes shown in the index column of FIG. 2.

In an embodiment, a process of encoding data into a codeword may correspond to a process of finding a codeword having the same index as data, and a process of decoding a codeword may correspond to a process of finding data having the same index as a codeword. Hereafter, the detailed configurations of an encoder to encode data into a codeword and a decoder to decode a codeword will be described on the basis of such a principle.

Figure 3:
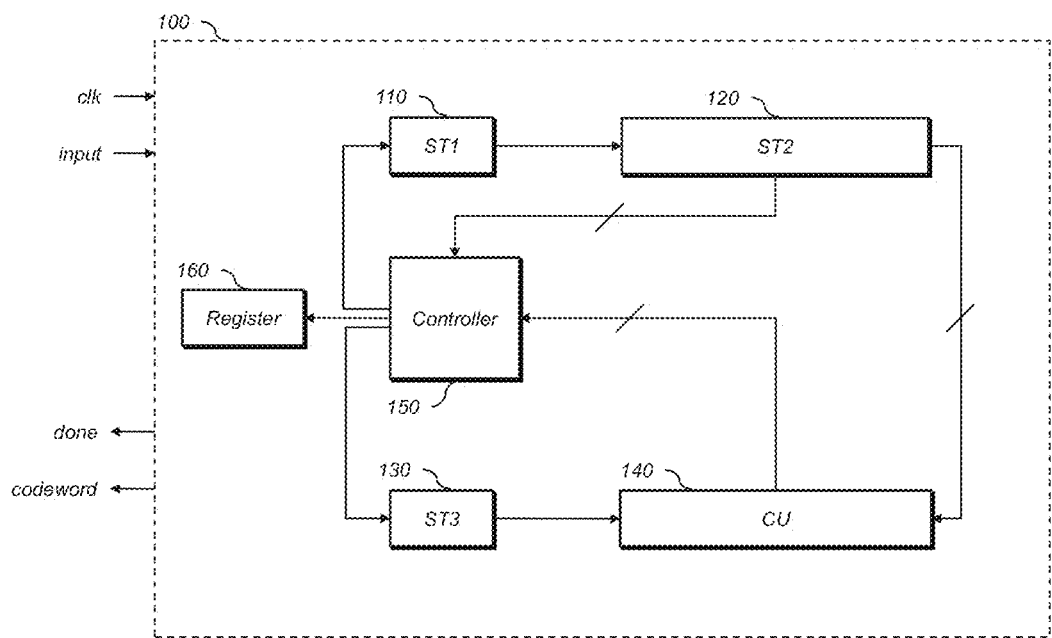
FIG. 3 is a block diagram representation of an encoder in accordance with an embodiment.

Referring to FIG. 3, the encoder 100 may receive a clock signal CLK and data INPUT, and may encode the received data into a codeword. The encoder 100 may output a done signal DONE which notifies that the codeword encoding is done, but a done signal DONE is not necessary for notification.

The encoder may include a first storage unit 110, a second storage unit 120, and a third storage unit 130. The encoder may also include a comparator 140, a controller 150, and a register 160.

The first storage unit 110 may store a first state value which is initialized according to M and $N_M$ (1≤m≤M). The second storage unit 120 may store M second state values. Each of the M second state values may correspond to any one of M symbols. The second state value is set according to a corresponding symbol and the first state value.

Figure 4:
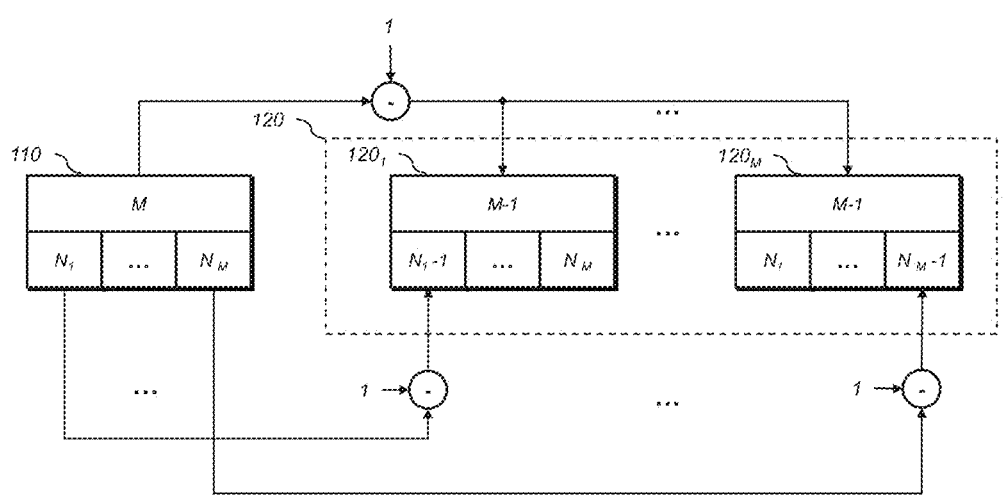
FIG. 4 is a block diagram representation of a first storage unit and a second storage unit.

Referring to FIG. 4 the first storage unit 110 may store the first state value and the second storage unit 120 may store the M second state values.

In an embodiment, the first state value may be represented as a vector $$\left( \sum_{m=1}^{m=M} N_m, N_1, N_2, \ldots, N_M \right)$$

at the initial stage of operation, and the magnitude of the first state value may be expressed as Equation 3 seen below.

$$\frac{\left( \sum_{m=1}^{m=M} N_m \right)!}{N_1! \times \ldots \times N_M!} \qquad [\text{Equation 3}]$$

Referring to Equation 3, when M symbols are arranged in order of magnitude (1≤k≤M) then $N_k$ is related to the number of k-th symbols.

The second state value is set by a corresponding symbol and the first state value. For example, a second state value corresponding to the k-th symbol may be represented as a vector $$\left( \sum_{m=1}^{m=M} N_m, N_1, \ldots, N_k - 1, \ldots, N_M \right)$$

at the initial stage of operation, and the magnitude of the second state value may be expressed as seen below in Equation 4.

$$\frac{\left( \sum_{m=1}^{m=M} N_m - 1 \right)!}{N_1! \times \ldots \times (N_k - 1)! \times \ldots \times N_M!} \qquad [\text{Equation 4}]$$

As such, when the first state value is set, the M second state values may be automatically determined according to the above-described rule.

In reference to FIG. 4, the second storage unit 120 may further include a subtracter hard-wired to the first storage unit 110. In other embodiments, the controller 150 may perform the operations of storing the second state value in the second storage unit 120 and updating the first state value. This will be described further below. In an embodiment, the controller 150 may generate M second state values by referring to the first state value. Thus, the second storage unit 120 for storing the second state values may not be separately provided. These embodiments will be further described below with reference to FIG. 13.

The operation of setting the M second state values according to the first state value may be easily embodied by those skilled in the art.

A number of factorial operations may be required in order to calculate the magnitudes of the first and second state values. A lot of time may be required to process the magnitudes of the first and second state values. Thus, the encoder may further include a lookup table for calculating the magnitudes of the first and second state values.

FIG. 5 illustrates, one example amongst many, for a lookup table and a method for calculating the magnitudes of the first and second state values using the lookup table.

Prior to determining M and $N_m$ (1≤m≤M), the lookup table may be generated according to M and $N_m$. For example, FIG. 5 illustrates a part of a lookup table which is previously generated when M=4 and $N_m$=9 (1≤m≤4).

Each row of the lookup table corresponds to any one of 1! to 36!, and each column corresponds to an exponent of a prime factors 2, 3, 5, or 7, obtained through prime factorization of a corresponding factorial value, or a remaining constant.

In the lookup table of FIG. 5, 35! may be expressed as in Equation 5 below.

$$35! = 2^{32} \cdot 3^{15} \cdot 5^8 \cdot 7^5 \cdot C_{35} \qquad [\text{Equation 5}]$$

The constant $C_{35}$ may be previously calculated and stored in the lookup table.

When the lookup table of FIG. 5 is used, the complex calculations expressed as Equations 3 and 4 may be replaced with a simple calculation as illustrated in FIG. 5.

For example, suppose a first state value has the meaning of the magnitude of the first state value obtained through Equation 3. Additionally, suppose that a second state value has the meaning of the magnitude of the second state value.

The third storage unit 130 included in the encoder 100 may store a third state value which may be reset to the value of the input data INPUT at the initial stage of the operation.

The comparator 140 included in the encoder 100 may compare the third state value stored in the third storage unit 130 to the M second state values stored in the second storage unit 120, and provide the comparison result to the controller 150.

Figure 6:
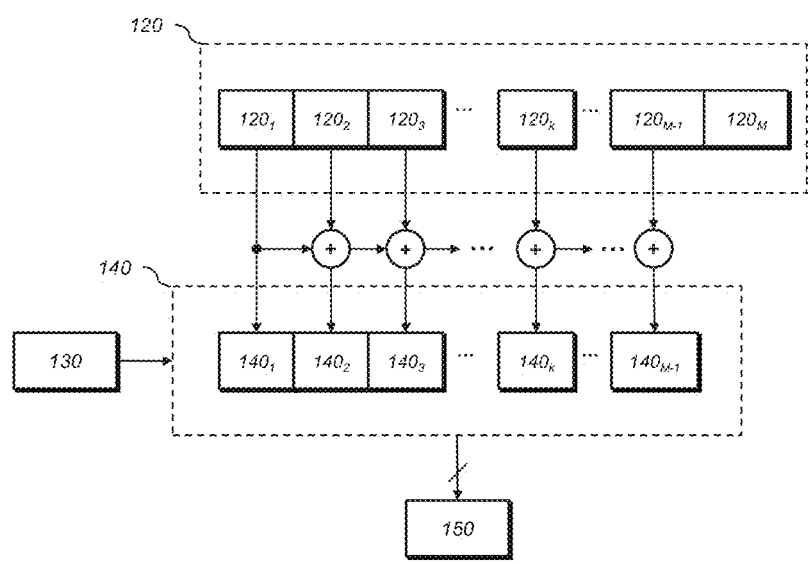
FIG. 6 is a block diagram representing the comparator of FIG. 3.

FIG. 6 is a block diagram representing the comparator 140 of FIG. 3.

The comparator 140 may include (M−1) comparison units $140_1$ to $140_{M-1}$.

The k-th comparator $140_k$ may compare the sum of second state values from a first second value to a k-th second state value with the third state value stored in the third storage unit 130 (1≤k≤M−1).

The k-th second state value may indicate a second state value corresponding to a k-th symbol when the second state values are arranged according to the magnitudes of corresponding symbols.

The comparison result of the comparator 140 may be provided to the controller 150.

The encoder 100 may include a controller 150. The controller 150 may determine one of the M symbols as one of the symbols forming a codeword by referring to the comparison result of the comparator 140. Then the controller 150 may update the first and third state values.

The controller 150 may include a determination unit 151, a first selection unit 152, and a second selection unit 153. The determination unit 151 may determine a symbol by referring to the comparison result of the comparator 140. The first selection unit 152 may update the first storage unit 110 according to the determined symbol. The second selection unit 153 may update the third storage unit 130 according to the determined symbol.

Figure 7:
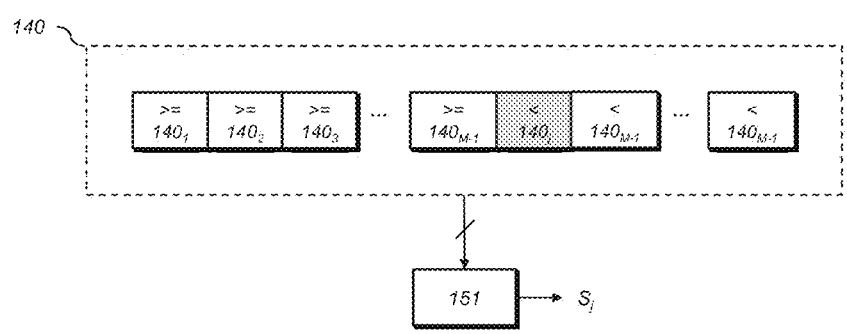
FIG. 7 is a block diagram representation for illustrating the function of a determination unit included in a controller of FIG. 3 that can be used to explain the operation of the determination unit.

FIG. 7 is a block diagram representation for explaining the operation of the determination unit 151.

Referring to FIG. 7, '≥' indicates a situation in which the third state value is equal to or greater than, and '<' indicates a situation in which the third state value is less than.

The determination unit 151 may analyze the outputs of the (M−1) comparison units, and determine a j-th symbol $S_j$ corresponding to a j-th comparison unit, at which the third state value starts to decrease, as one of the symbols forming the codeword.

When all of the (M−1) comparison units output the result whereby the third state value is less, the determination unit 151 may determine an m-th symbol $S_M$ for one of the symbols forming the codeword.

Figure 8:
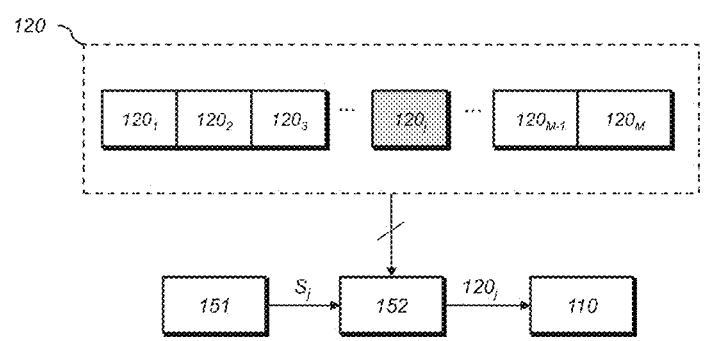
FIG. 8 is a block diagram representation for illustrating the function of a first selection unit included in the controller of FIG. 3 that can be used to explain the operation of the first selection unit.

FIG. 8 is a block diagram representation for illustrating the operation of the first selection unit 152.

The first selection unit 152 may refer to the symbol $S_j$ determined by the determination unit 151, and update the first state value such that a j-th second state value $120_j$ corresponding to the symbol $S_j$ among the M second state values becomes a new first state value.

The plurality of M second state values may be updated according to the rule described with reference to FIG. 4 above when the first state value is updated.

Figure 9:
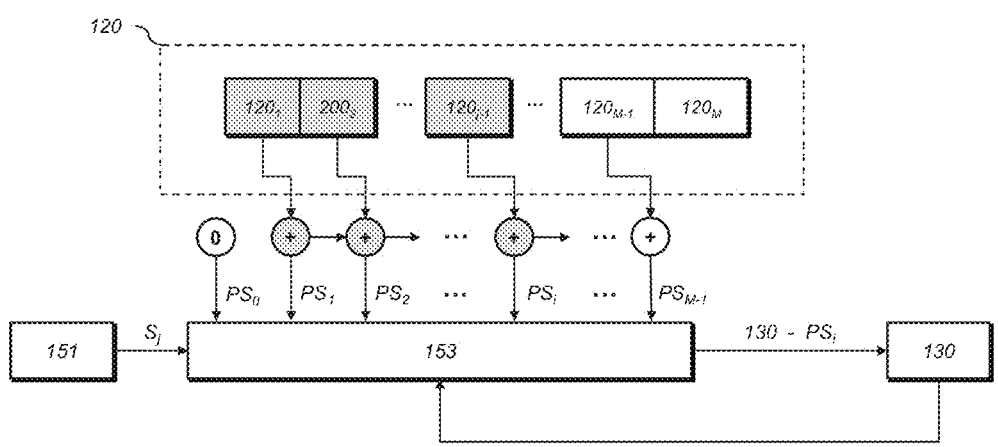
FIG. 9 is a block diagram representation for illustrating the function of a second selection unit included in the controller of FIG. 3 that can be used to explain the operation of the second selection unit.

FIG. 9 is a block diagram representation for illustrating the operation of the second selection unit 153 that can be used to explain the operation of the second selection unit 153.

The second selection unit 153 may refer to the symbol $S_j$ determined by the determination unit 151, and update the third state value such that a difference between an i-th partial sum $PS_i$ corresponding to the determined symbol $S_j$ among the M second state values and the third state value stored in the third storage unit 130 is updated as a new third state value.

The i-th partial sum $PS_i$ may be defined as the sum of second state values from the first second state value $120_1$ to the i-th second state value 120. Here, i=j−1, 1≤j≤M, and $PS_0$=0.

Figure 10:
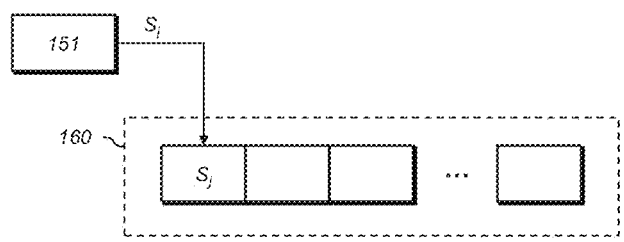
FIG. 10 is a block diagram illustrating a register that may be used for storing a code word.

FIG. 10 illustrates the register 160 that may be used for storing a code word.

The symbol $S_j$ which was determined by the controller 150 may be sequentially stored in the register 160. The controller 150 may determine one symbol during one period of the clock signal CLK. Then store the determined symbol in the register 160. Finally, the controller 150 may then update the first and second storage units 110 and 130.

During the next period of the clock signal CLK, the controller 150 may determine the next symbol, and then store the determined symbol in the register 160. Next, the controller 150 may update the first and third storage units 110 and 130.

Thus, the controller 150 may store a codeword corresponding to the input data in the register 160, during the $$\sum_{m=1}^{m=M} N_m$$

cycles of the clock signal as represented by this equation.

Figure 11:
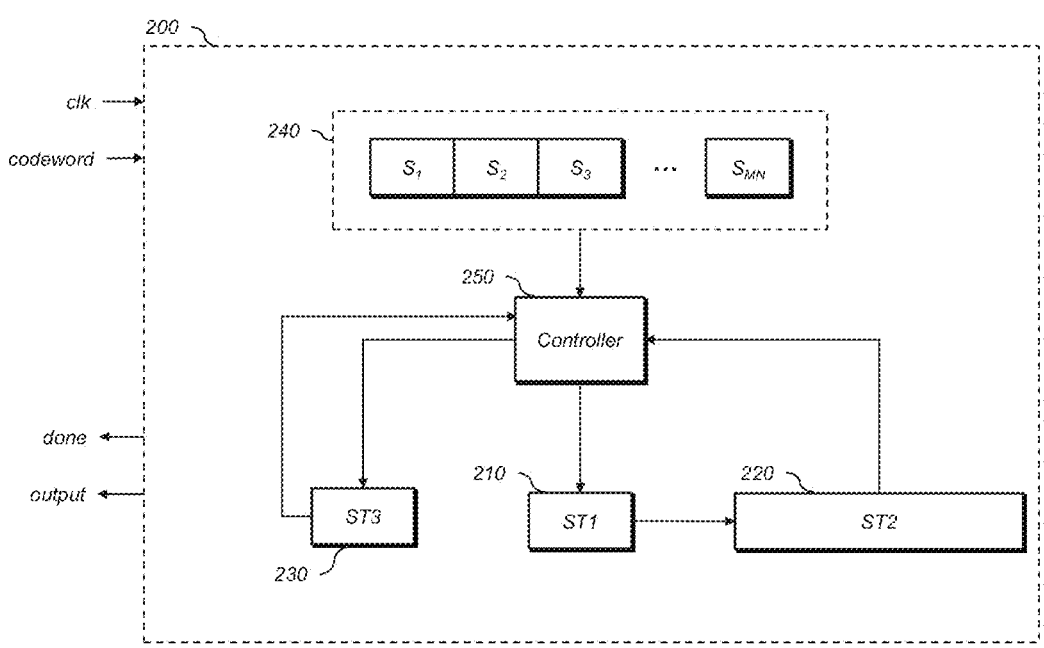
FIG. 11 is a block diagram representation of a decoder in accordance with an embodiment.

FIG. 11 is a block diagram representation of a decoder 200.

The decoder 200 may receive a clock signal CLK and a codeword. Then, decode the codeword, and output the decoding result OUTPUT. The decoder 200 may then output a done signal DONE which notifies that the decoding is done. However, the done signal DONE is not absolutely necessary.

The decoder 200 may include a first storage unit 210, a second storage unit 220, and a third storage unit 230. The decoder 200 may also include a register 240, and a controller 250.

The register 240 may store the codeword to be decoded.

The first storage unit 210 may store a first state value which is initialized according to M and $N_m$ (1≤m≤M), as shown in FIG. 4 and Equations 3 and 4. The second storage unit 220 may correspond to any one of M symbols, and store M second state values which are determined according to the corresponding symbol and the first state value. The configurations of the first and second storage units 210 and 220 and the relation between the first state value and the M second state values are the same as described with reference to FIG. 4. Thus, the duplication of descriptions is omitted here.

The third storage unit 230 may store a third state value corresponding to the decoding result, and may be updated by the controller 250 until the decoding has finished or stopped.

The controller 250 may sequentially select $$\sum_{m=1}^{m=M} N_m,$$

as represented by this equation, symbols included in the codeword of the register 240 at each period of the clock signal CLK. Then, update the first and third state values according to the selected symbols, and output the decoding result after total $$\sum_{m=1}^{m=M} N_m$$

cycles, as represented by this equation.

Figure 12:
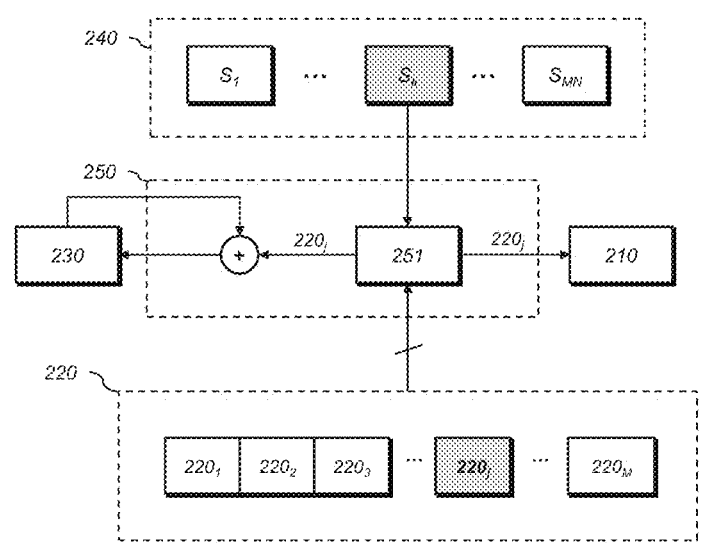
FIG. 12 is a block diagram representation for illustrating the operation of a controller of FIG. 11 that can be used to explain the operation of the controller.

FIG. 12 is a block diagram representation for illustrating the operation of the controller 250 that can be used to explain the operation of the controller 250.

The controller 250 may include a determination unit 251. The determination unit 251 may recognize a symbol $S_k$ corresponding to a current cycle in the codeword stored in the register 240, and then determine one of the M second state values corresponding to the symbol $S_k$.

The controller 250 may update the first storage unit 210 such that the determined second state $220_j$ becomes a new first state value. When the first state value is updated, the M second state values of the second storage unit 220 may also be updated according to the rule described with reference to FIG. 4 above.

Furthermore, the controller 250 may update the third state value such that the sum of the determined second state values $220_j$ and the third state value become new third state values. When the above-described operation is sequentially performed for all of the $$\sum_{m=1}^{m=M} N_m$$

symbols, as represented by this equation, the third state value may indicate the decoding result of the input codeword.

Figure 13:
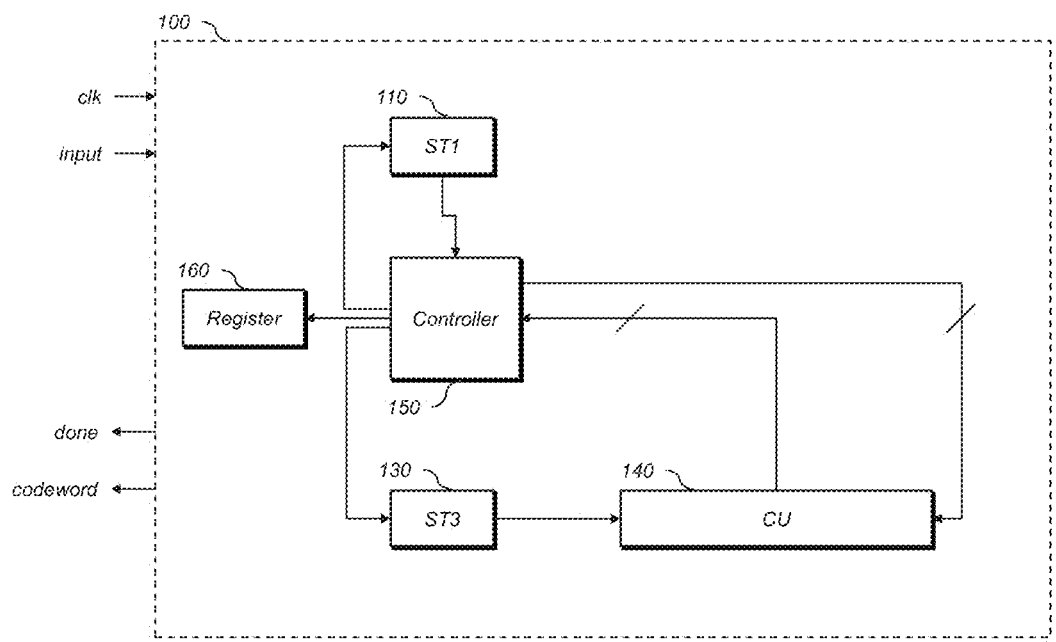
FIG. 13 is a block diagram representation illustrating an encoder in accordance with an embodiment.

FIG. 13 is a block diagram representation illustrating an encoder in accordance with an embodiment.

When a first state value is determined as described with reference to FIG. 4, M second state values may be automatically determined according to the rule as discussed above with reference to FIG. 4.

The present embodiments are different from the embodiments of FIG. 3 in that the controller 150 generates M second state values and provides the M second state values to the surrounding components, instead of the second storage unit 120 for storing the second state values.

The configuration and functions described with reference to FIGS. 4 through 10 above may be applied to the present embodiments in substantially the same manner, except for the fact that the M second state values are provided from the controller 150 instead of the second storage unit 120.

Figure 14:
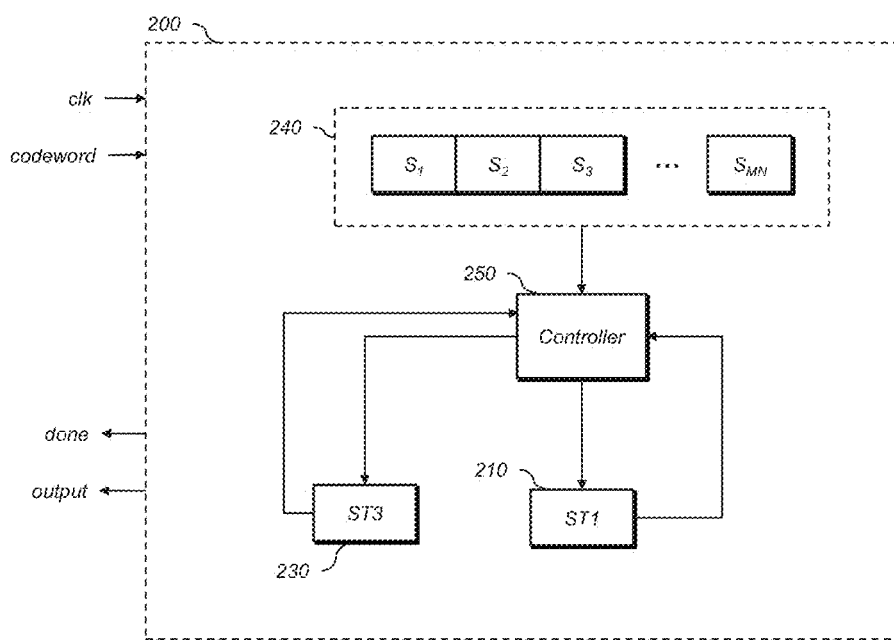
FIG. 14 is a block diagram illustrating a decoder in accordance with an embodiment.

FIG. 14 is a block diagram illustrating a decoder in accordance an embodiment.

When a first state value is determined as described with reference to FIG. 4, M second state values may be automatically determined according to the rule associated with FIG. 4 above.

The present embodiments are different from the embodiments associated with FIG. 11 in that the controller 250 generates M second state values and provides the generated M second state values to surrounding components, instead of using the second storage unit 220 to store the second state values.

The configurations and functions described with reference to FIGS. 12 and 13 may be applied to the present embodiments in the same manner except that the M second state values are provided from the controller 250 instead of the second storage unit 220.

Figure 15:
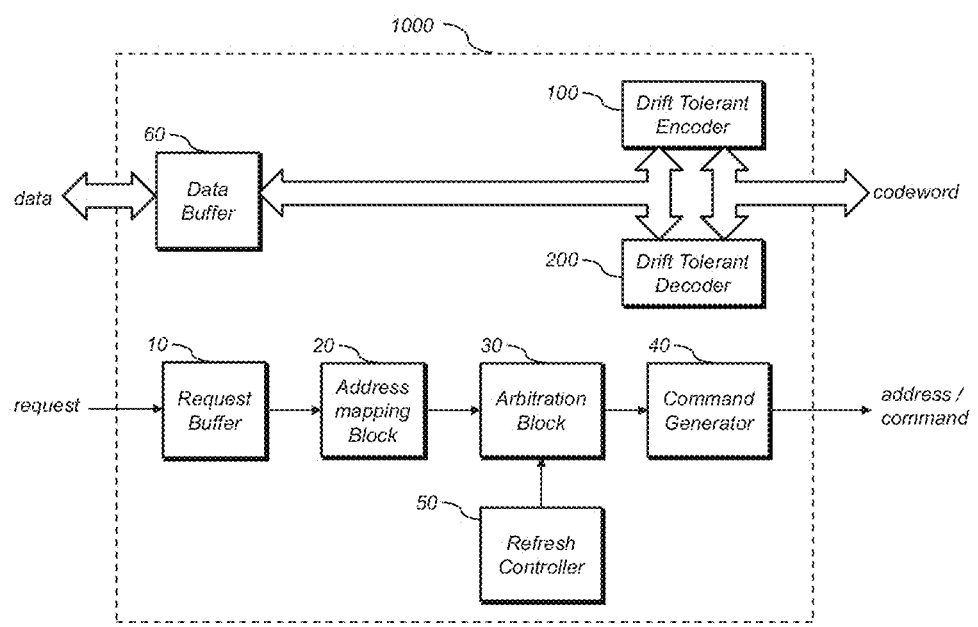
FIG. 15 is a block diagram representation of a memory controller in accordance with an embodiment.

FIG. 15 is a block diagram representation of a memory controller in accordance with an embodiment.

The memory controller 1000 illustrated in FIG. 15 may be provided independently or embedded in another semiconductor device such as a processor.

The memory controller 1000 in accordance with the present embodiments may include an encoder 100 and a decoder 200. The encoder 100 may convert data requested from a host into a codeword and provide the codeword to a semiconductor memory device (not illustrated). The decoder 200 may decode a codeword provided from the semiconductor memory device and output the decoded codeword. The configuration of the encoder 100 has been described in detail with reference to FIGS. 3 through 10 and 13. The configuration of the decoder 200 has been described in detail with reference to FIGS. 11, 12, and 14. Thus, the duplicated descriptions are omitted herein.

The memory controller 1000 in accordance with the present embodiments may include a request buffer 10, an address mapping block 20, and an arbitration block 30. The memory controller 1000 may also include a command generator 40, a refresh controller 50, and a data buffer 60.

Through testing prior to the performing of an encoding operation or decoding operation, the time required for the encoder 100 or the decoder 200 to perform an encoding operation or decoding operation may be previously set. The memory controller 1000 may consider the encoding or decoding time when determining a timing schedule.

Figure 16:
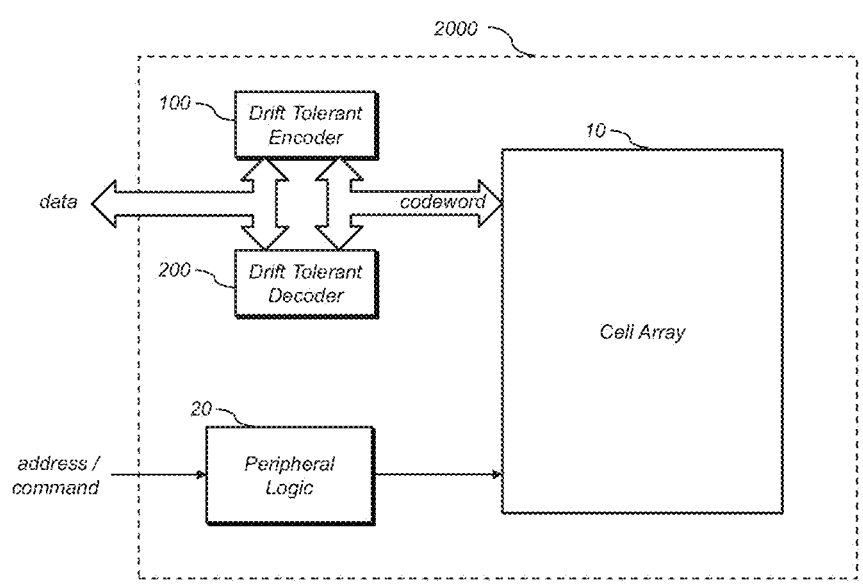
FIG. 16 is a block diagram representation of a semiconductor memory device in accordance with an embodiment.

FIG. 16 is a block diagram representation of a semiconductor memory device.

The semiconductor memory device 2000 in accordance with the present embodiments may include an encoder 100 and a decoder 200. The encoder 100 may convert data provided from a memory controller (not illustrated) into a codeword, and provide the codeword to a cell array 10. The decoder 200 may decode a codeword read from the cell array 10, and provide the decoded codeword to the memory controller. The configuration of the encoder 100 has been described in detail with reference to FIGS. 3 through 10 and 13 above. The configuration of the decoder 200 has been described in detail with reference to FIGS. 11, 12, and 14 above. Thus, the duplicated descriptions are omitted herein.

Furthermore, the semiconductor memory device 2000 may further include a peripheral logic circuit 20 configured to analyze an address and command provided from the memory controller and control the cell array 10. A detailed description of the peripheral logic circuit 20 has been omitted.

The operation principles of the semiconductor memory device 2000 may be maintained in substantially the same manner except that the encoder 100 and the decoder 200 additionally perform conversions between data and codewords.

In accordance with the embodiments, it may be possible to normally recover data through the encoder, the decoder, and the semiconductor device including the same.

Although various embodiments have been described for illustrative purposes, it will be apparent to those skilled in the art that various changes and modifications may be made without departing from the spirit and scope of the invention as defined in the following claims.

What is claimed is:

1. A semiconductor device configured to encode input data into a codeword including M different symbols, each of which includes $N_m$ symbols, where M, m, and $N_m$ are natural numbers and m is greater than or equal to one and m is less than or equal to M, the semiconductor device comprising:
    a first storage unit configured to store a first state value which is reset according to M and $N_m$;
    a second storage unit corresponding to any one of the M different symbols and configured to store M second state values determined through the corresponding symbol and the first state value;
    a third storage unit configured to store a third state value and reset the third state value to the value of the input data;
    a comparator configured to compare the M second state values to the third state value; and
    a controller configured to select any one of the M different symbols as one of symbols forming the codeword according to the comparison result, and update the first state value and the third state value.

2. The semiconductor device of claim 1, wherein the comparator comprises a plurality of comparison units each configured to compare the sum of second state values from a first second state value to a k-th second state value to the third state value, and
    wherein M is greater than one, and k is greater than or equal to one and k is less than or equal to M minus one.

3. The semiconductor device of claim 2, wherein the controller comprises:
    a determination unit configured to determine a j-th symbol among the M symbols according to outputs of the plurality of comparison units;

a first selection unit configured to provide the j-th second state value to the first storage unit according to the determined symbol, and update the first state value; and
a second selection unit configured to provide a difference between an i-th partial sum and the third state value according to the determined symbol, and update the third state value,
wherein M is greater than one, j is greater than or equal to one and j is less than or equal to M, the i-th partial sum indicates the sum of second state values from the first second state value to the i-th second state value, i equals j−1, and
wherein a zero-th partial sum is zero.

4. The semiconductor device of claim 1, wherein the first state value at an initial stage is given as $$\frac{\left(\sum_{m=1}^{m=M} N_m\right)!}{N_1! \times \ldots \times N_M!},$$

and
a k-th second state value among the M second state values at the initial stage is given as $$\frac{\left(\sum_{m=1}^{m=M} N_m - 1\right)!}{N_1! \times \ldots \times (N_k - 1)! \times \ldots \times N_M!},$$

where $N_k$ is the number of k-th symbols among the M symbols and k is greater than or equal to one and k is less than or equal to M.

5. The semiconductor device of claim 4, further comprising a lookup table configured to store calculation information on K! where K is an integer equal to or less than $$\sum_{m=1}^{m=M} N_m.$$

6. The semiconductor device of claim 5, wherein the lookup table is configured to store information on exponents of one or more prime factors obtained through prime factorization for K!.

7. The semiconductor device of claim 1, wherein the controller is configured to sequentially update the first and third storage units during each period of a clock signal, and complete the codeword after $$\sum_{m=1}^{m=M} N_m$$

cycles.

8. The semiconductor device of claim 7, further comprising a register configured to store the codeword.

9. A semiconductor device that configured to decode a codeword including M different symbols, each of which includes $N_m$ symbols, where M, m, and $N_m$ are natural numbers and m is greater than or equal to one and m is less than or equal to M, the semiconductor device comprising:

a first storage unit configured to store a first state value which is reset according to M and $N_m$;
a second storage unit corresponding to any one of the M different symbols and configured to store M second state values determined through the corresponding symbol and the first state value;
a third storage unit configured to store a decoding result; and
a controller configured to select any one of the M second state values according to a currently selected symbol of the codeword, and update the first storage unit and the third storage unit using the selected second state value.

10. The semiconductor device of claim 9, wherein the controller is configured to update the first and third storage units at each period of a clock signal, and complete the codeword decoding after $$\sum_{m=1}^{m=M} N_m$$

cycles.

11. The semiconductor device of claim 9, wherein the first state value at an initial stage is given as $$\frac{\left(\sum_{m=1}^{m=M} N_m\right)!}{N_1! \times \ldots \times N_M!},$$

and
a k-th second state value among the M second state values at the initial stage is given as $$\frac{\left(\sum_{m=1}^{m=M} N_m - 1\right)!}{N_1! \times \ldots \times (N_k - 1)! \times \ldots \times N_M!},$$

wherein $N_k$ is the number of k-th symbols among the M symbols and k is greater than or equal to one and k is less than or equal to M.

12. The semiconductor device of claim 11, further comprising:
a lookup table configured to store calculation information on K!,
wherein K is an integer equal to or less than $$\sum_{m=1}^{m=M} N_m.$$

13. The semiconductor device of claim 12, wherein the lookup table stores information on exponents of one or more prime factors obtained through prime factorization for K!.

14. A semiconductor device configured to encode input data into a codeword including M different symbols, each of which includes $N_m$ symbols, where M, m, and $N_m$ are natural numbers and m is greater than or equal to one and m is less than or equal to M, the semiconductor device comprising:
a first storage unit configured to store a first state value which is reset according to M and $N_m$;

a third storage unit configured to store a third state value and reset the third state value to the value of the input data;

a comparator configured to compare M second state values to the third state value; and a controller corresponding to any one of the M different symbols and configured to generate the M second state values determined through the corresponding symbol and the first state value, wherein the controller is configured to select any one of the M different symbols as one of a plurality of symbols forming the codeword according to the comparison result, and update the first state value and the third state value.

15. A semiconductor device configured to decode a codeword including M different symbols, each of which includes $N_m$ symbols, where M, m, and $N_m$ are natural numbers and m is greater than or equal to one and m is less than or equal to M, the semiconductor device comprising:

a first storage unit configured to store a first state value which is reset according to M and $N_m$;

a third storage unit configured to store a decoding result; and a controller corresponding to any one of the M different symbols and configured to generate M second state values determined through the corresponding symbol and the first state value, wherein the controller is configured to select any one of the M second state values according to a currently selected symbol of the codeword, and update the first storage unit and the third storage unit using the selected second state value.

16. A semiconductor device comprising:

an encoder configured to encode data provided from a host into a codeword including M different symbols, each of which includes $N_m$ symbols, where $N_m$ is a natural number and m is greater than or equal to one and m is less than or equal to M; and a decoder configured to decode the codeword provided from a semiconductor memory device, wherein a relation among M, $N_m$ and a length of data L is given as $$2^L \leq \frac{\left(\sum_{m=1}^{m=M} N_m\right)!}{N_1! \times \ldots \times N_M!}.$$

17. The semiconductor device of claim 16, wherein the encoder comprises:

a first storage unit configured to store a first state value which is reset according to M and $N_m$;

a second storage unit corresponding to any one of the M different symbols and configured to store M second state values determined through the corresponding symbol and the first state value;

a third storage unit configured to store a third state value and reset the third state value to the value of the input data;

a comparator configured to compare the M second state values to the third state value; and a controller configured to select any one of the M different symbols as one of symbols forming the codeword according to the comparison result, and update the first state value and the third state value.

18. The semiconductor device of claim 16, wherein the decoder comprises:

a first storage unit configured to store a first state value which is reset according to M and $N_m$;

a second storage unit corresponding to any one of the M different symbols and configured to store M second state values determined through the corresponding symbol and the first state value;

a third storage unit configured to store a third state value and reset the third state value to the value of the input data;

a third storage unit configured to store a decoding result; and a controller configured to select any one of the M second state values according to a currently selected symbol of the codeword, and update the first storage unit and the third storage unit using the selected second state value.

19. The semiconductor device of claim 16, wherein the encoder comprises:

a first storage unit configured to store a first state value which is reset according to M and $N_m$;

a third storage unit configured to store a third state value and reset the third state value to the value of the input data;

a comparator configured to compare the M second state values to the third state value; and a controller corresponding to any one of the M different symbols and configured to generate M second state values determined through the corresponding symbol and the first state value, wherein the controller is configured to select any one of the M different symbols as one of symbols forming the codeword according to the comparison result, and update the first state value and the third state value.

20. The semiconductor device of claim 16, wherein the decoder comprises:

a first storage unit configured to store a first state value which is reset according to M and $N_m$;

a third storage unit configured to store a decoding result; and a controller corresponding to any one of the M different symbols and configured to generate M second state values determined through the corresponding symbol and the first state value, wherein the controller is configured to select any one of the M second state values according to a currently selected symbol of the codeword, and update the first storage unit and the third storage unit using the selected second state value.

21. The semiconductor device of claim 16, wherein the semiconductor memory device comprises a nonvolatile memory device.

22. A semiconductor device comprising:

a memory cell array configured to store a codeword including M different symbols, each of which includes $N_m$ symbols, where $N_m$ is a natural number and m is greater than or equal to one and m is less than or equal to M;

an encoder configured to encode input data into the codeword and input the encoded data to the memory cell array; and a decoder configured to decode the codeword received from the memory cell array and output the decoded codeword, wherein a relation among M, $N_m$ and a length of data L is given as $$2^L \le \frac{\left(\sum_{m=1}^{m=M} N_m\right)!}{N_1! \times \ldots \times N_M!}.$$

23. The semiconductor device of claim 22, wherein the encoder comprises:
   a first storage unit configured to store a first state value which is reset according to M and $N_m$;
   a second storage unit corresponding to any one of the M different symbols and configured to store M second state values determined through the corresponding symbol and the first state value;
   a third storage unit configured to store a third state value and reset the third state value to the value of the input data;
   a comparator configured to compare the M second state values to the third state value; and
   a controller configured to select any one of the M different symbols as one of symbols forming the codeword according to the comparison result, and update the first state value and the third state value.

24. The semiconductor device of claim 22, wherein the decoder comprises:
   a first storage unit configured to store a first state value which is reset according to M and $N_m$;
   a second storage unit corresponding to any one of M different symbols and configured to store M second state values determined through the corresponding symbol and the first state value;
   a third storage unit configured to store a decoding result; and
   a controller configured to select any one of the M second state values according to a currently selected symbol of the codeword, and update the first storage unit and the third storage unit using the selected second state value.

25. The semiconductor device of claim 22, wherein the encoder comprises:
   a first storage unit configured to store a first state value which is reset according to M and $N_m$;
   a third storage unit configured to store a third state value and reset the third state value to the value of the input data;
   a comparator configured to compare the M second state values to the third state value; and
   a controller corresponding to any one of the M different symbols and configured to generate M second state values determined through the corresponding symbol and the first state value,
   wherein the controller is configured to select any one of the M different symbols as one of symbols forming the codeword according to the comparison result, and update the first state value and the third state value.

26. The semiconductor device of claim 22, wherein the decoder comprises:
   a first storage unit configured to store a first state value which is reset according to M and $N_m$;
   a third storage unit configured to store a decoding result; and
   a controller corresponding to any one of the M different symbols and configured to generate M second state values determined through the corresponding symbol and the first state value,
   wherein the controller is configured to select any one of the M second state values according to a currently selected symbol of the codeword, and update the first storage unit and the third storage unit using the selected second state value.

* * * * *